(12) United States Patent
Lee

(10) Patent No.: US 7,005,700 B2
(45) Date of Patent: Feb. 28, 2006

(54) DOUBLE-GATE FLASH MEMORY DEVICE

(76) Inventor: Jong Ho Lee, Damoa APT 101-310, wolpyung-dong, Seo-gu, Daejeon-si (KR) 302-749

( * ) Notice: Subject to any disclaimer, the term of this patent is extended or adjusted under 35 U.S.C. 154(b) by 0 days.

(21) Appl. No.: 10/751,860

(22) Filed: Jan. 6, 2004

(65) Prior Publication Data

US 2005/0145926 A1    Jul. 7, 2005

(51) Int. Cl.
*H01L 29/788*    (2006.01)
(52) U.S. Cl. ............... 257/316; 257/316; 257/314
(58) Field of Classification Search ............... 257/316, 257/314, 315, 329, 14, 618
See application file for complete search history.

(56) References Cited

U.S. PATENT DOCUMENTS

| | | | |
|---|---|---|---|
| 5,670,790 A * | 9/1997 | Katoh et al. ............... 257/14 |
| 5,774,400 A * | 6/1998 | Lancaster et al. ........ 365/185.3 |
| 6,525,403 B1 * | 2/2003 | Inaba et al. ............... 257/618 |
| 6,583,469 B1 * | 6/2003 | Fried et al. ............... 257/329 |
| 6,657,252 B1 * | 12/2003 | Fried et al. ............... 257/316 |

* cited by examiner

Primary Examiner—David Nelms
Assistant Examiner—Thinh T Nguyen
(74) Attorney, Agent, or Firm—Harness, Dickey & Pierce, P.L.C.

(57) ABSTRACT

The conventional flash memory device is fabricated by the MOS processing technology on a bulk substrate and has a similar configuration to an MOS device.

While the conventional CMOS device has a superior scaling down characteristic, the scaling down characteristic of a flash memory device is poor due to the inability to reduce the thickness below 7 nm or 8 nm for the tunneling oxide film where the charges in the channel are tunneled into the floating electrode through the tunneling oxide.

In order to resolve this problem, the present invention, instead of a SOI wafer, uses a cheaper bulk silicon wafer with lower defect density. A wall shape Fin active region where the channel and the source/drain are formed is connected to the bulk silicon substrate by which floating body effect and heat conduction problem are resolved. a flash memory device is fabricated by forming a tunneling oxide film on side surfaces of the Fin active and a floating (storage) electrode where the charges could be stored.

The above structure has a superior scaling down characteristic and enhanced memory performance due to a double-gate flash memory device structure.

27 Claims, 15 Drawing Sheets

- PRIOR ART -

- PRIOR ART -

- PRIOR ART -

- PRIOR ART -

DOUBLE-GATE FLASH MEMORY DEVICE

BACKGROUND OF THE INVENTION

The present invention relates to a double-gate flash memory device formed on a bulk silicon substrate. More particularly, the invention relates to the structure of a flash memory device which has higher integration density and better program/erase characteristic in comparison to prior art flash memory devices.

A flash memory device has many practical applications, apart from the use in memory itself, it could also be used in various types of electronic apparatus.

A flash memory device is found to be especially suitable for the recently developed embedded logic technology and shows a good process compatibility with the logic technology during the fabrication process.

A highly functional and integrated flash memory device, apart from the use in memory itself, has the potential to bring significant added values in conjunction with logic technology. This fact has attracted a large amount of research activities in this area around the world.

As the size of a Complementary Metal-Oxide Semiconductor (CMOS) silicon semiconductor device is being reduced to 100 nm or below, the power consumption is reduced and the integration density is enhanced to allow the implementation of a very fast VLSI device possible. Consequently, it has resulted a reduction in the size of various electronic systems and brought about a significant improvement in the system performance through the decrease in the power consumption.

This was mainly possible due to the good scaling down characteristics of CMOS devices. The gate size of these devices is being continuously scale-downed up to a channel size of sub-50 nm. In addition to the scaling down of these CMOS devices, the characteristics of flash memory devices that utilize the advanced CMOS fabrication process should be improved in order to bring about significant added values.

Hereinafter, the prior art flash memory devices will be described in detail with reference to the accompanying drawings.

FIG. 1a and FIG. 1b show an example of scaling down of a conventional flash memory device.

Looking into FIG. 1b in comparison to FIG. 1a, it is noticed that the gate height and the junction depth as well as the channel length are reduced, however, the thickness between a tunneling oxide film (66) and a storage electrode (68) and that of the inter-gates oxide film (70) between a floating electrode and a control electrode (72) are not reduced.

A conventional metal-oxide semiconductor (MOS) device can easily restrain a short-channel effect by using a thin gate oxide film according to the scaling down, however, a flash memory device cannot be scaled down easily due to non-scalable gate insulators.

A flash memory device has a similar configuration to a conventional CMOS device except having a storage electrode (68) for storing electric charges between a control electrode (20) and a channel of the device.

A tunneling oxide film (66) is constituted under the storage electrode (68), and the thickness of a tunneling oxide film (66) cannot be reduced with the scaling down.

If the thickness of the tunneling oxide film (66) is reduced, the charges stored in the storage electrode (68) leaks back to the channel, and thus the retention characteristic of a memory becomes to deteriorate.

Hence, it is necessary to employ various types of methods to resolve this problem. As shown in FIG. 1, the thickness of the tunneling oxide film (66) of a flash memory device in the prior art could not be reduced. This is the main reason why the channel length of a flash memory device could not be reduced in spite of the advanced CMOS technology environment.

More specifically, in order to reduce the channel length of a flash memory device, the thickness of the tunneling oxide film (66) which corresponds to a gate oxide film in a CMOS device should be reduced.

However, if the thickness of the tunneling oxide film (66) is reduced, then the important retention characteristic for memory could not be guaranteed.

Eventually, the values of the present flash memory devices are bound to fall sooner or later.

Fortunately, researches on Silicon-Oxide-Nitride-Oxide-Semiconductor (SONOS) type flash memory device, which has a somewhat modified configuration compared with that of a conventional flash memory device, are currently being carried on.

The configuration of SONOS type device is the same as that of FIG. 1a and FIG. 1b with the substance of the storage electrode (68) being substituted with a silicon nitride film (Si3N4).

In an SONOS type flash memory device, however, the thickness of Oxide-Nitride-Oxide (ONO) film, which corresponds to a gate oxide film in a CMOS device, is still thicker than that of the gate oxide film (for example, 2 nm/4 nm/4 nm), and thus the scaling down characteristic is worse than that of CMOS device having the same gate length.

Additionally, there exist traps, in which charges can be stored, in the nitride film corresponding to N in an ONO-structure, and thus charges are trapped therein during a writing program.

Since the trap density is non-uniform, it requires gate length and width over a certain minimum value, and thus it has a limitation in improving integration density.

From the researches of conventional CMOS devices, a double-gate device formed on a SOI silicon substrate is appearing in the recent publications. The characteristic of this device shows that it could have the shortest channel length amongst the known devices to date.

FIG. 2a and FIG. 2b show that an example of a double-gate device formed on a SOI silicon substrate (2a) either in a transparent or non-transparent diagram.

The double-gate device constitutes a gate electrode (76) on either side of the channel (or top and bottom) in order to achieve a significant improvement on the short channel effect.

Since all of the conventional double-gate MOS devices are formed on a SOI substrate, the SOI wafer has the disadvantage of being more expensive than a bulk wafer. Also, the conventional double-gate MOS devices have the problem of a floating body problem.

Moreover, Buried Oxide (BOX) formed on a SOI silicon substrate (2a) blocks the heat conduction from the device to the SOI silicon substrate (2a), resulting in deterioration of the device characteristic.

SUMMARY OF THE INVENTION

The present invention is designed to overcome the above problems of the prior art mentioned above.

The object of the present invention is to provide a double-gate flash memory device and fabrication method thereof, by introducing a bulk type double-gate flash memory device that is capable of improving the scaling down characteristic of a conventional MOS type flash memory device as well as its memory characteristic and ultimately capable of improving the performance and integration density of a flash memory device.

Another object of the present invention is to provide a double-gate flash memory device and fabrication method thereof, in which a Fin active region is connected to a bulk silicon substrate by using bulk Si wafer in order to resolve the problems of a conventional SOI device including the floating body effect, the current leakage and the problem of heat conduction towards the SOI silicon substrate, and thus reducing the cost of a wafer.

In order to achieve the above stated objects, the double-gate flash memory device according to the present invention comprises of; a bulk silicon substrate; a wall-shape single crystal silicon Fin active region which is formed on the upper section of said bulk silicon substrate and is connected to said bulk silicon substrate; a second oxide film which is formed on said bulk silicon substrate and is formed to a certain height of said Fin active region; a tunneling oxide film on said second oxide film which is formed on the both side walls of the Fin active region; a first oxide film which is formed on the upper surface of said Fin active region with the same or a thicker thickness value than that of the tunneling oxide film; a storage electrode which is formed on the tunneling oxide, the first and second oxide films in order to store electric charges; an inter-gates oxide film which is formed on said storage electrode; a control electrode which is formed on said inter-gates oxide film; a source/drain which is formed on the both sides of the Fin active region excluding the Fin active region which overlaps with said control electrode; and contact regions and metal layers which are formed at the contact areas of said source, drain, and control electrode.

Also, the double-gate flash memory device fabrication method according to the present invention comprises the steps of; forming a wall-shape Fin active region; forming a second oxide film on said bulk silicon substrate which is formed to a certain height of said Fin active region; forming a tunneling oxide film on the both side walls of the Fin active region which is formed on said second oxide film; forming a first oxide film on the upper surface of said Fin active region with the same or a thicker thickness value than that of the tunneling oxide film; forming a storage electrode on the tunneling oxide, the first and second oxide films in order to store electric charges; forming an inter-gates oxide film on said storage electrode; forming a control electrode on said inter-gates oxide film; forming a source/drain on the both sides of the Fin active region excluding the Fin active region which overlaps with said control electrode; and forming contact regions and metal layers at the contact areas of said source, drain, and control electrode.

DESCRIPTION OF THE NUMERIC ON THE MAIN PARTS OF THE DRAWINGS

2: Silicon Substrate
2a: SOI Silicon Substrate
2b: Bulk Silicon Substrate
4: Fin Active Region
6: First Oxide Film
10: Second Oxide Film
12: Tunneling Oxide Film
14: Nitride Film
16: Control Electrode
18: Selective Epitaxial Layer
20: Third Oxide Film
22: Buffer Oxide Film
24: Nitride Film Preventing Oxidation
26: Spacer Oxide Film
28: Field Oxide Film
30: Spacer
32: Storage Electrode
34: Inter-Gates Oxide Film
36: Spacer Storage Electrode
38: Storage Electrode 40: Body
46: Contact Region
48: Metal Layer
64: Source/Drain
66: Tunneling Oxide Film
68: Storage Electrode
70: Inter-Gates Oxide Film
72: Control Electrode
74: Gate Oxide Film
76: Gate Electrode

DETAILED DESCRIPTION OF THE EMBODIMENTS

Hereinafter, preferred embodiments of the present invention will be described in detail with reference to the accompanying drawings.

The present invention relates to a flash memory device which has an increased memory capacity through the improvement in integration density by applying the fact that a double-gate device could improve a short channel effect through scaling down of a flash memory device.

Figure 3A:
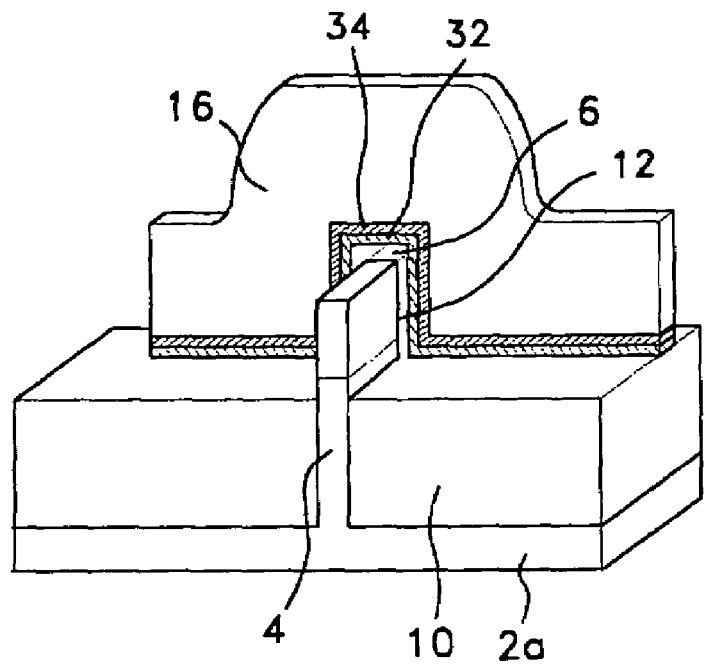
FIG. 3a and FIG. 3b are projected view and plan view, respectively, of the flash memory device according to one embodiment of the present invention.

FIG. 3a is a 3-dimensional diagram which shows the essential parts of a double-gate flash memory device in which a Fin active region of the device is connected to a bulk silicon substrate.

Figure 3B:
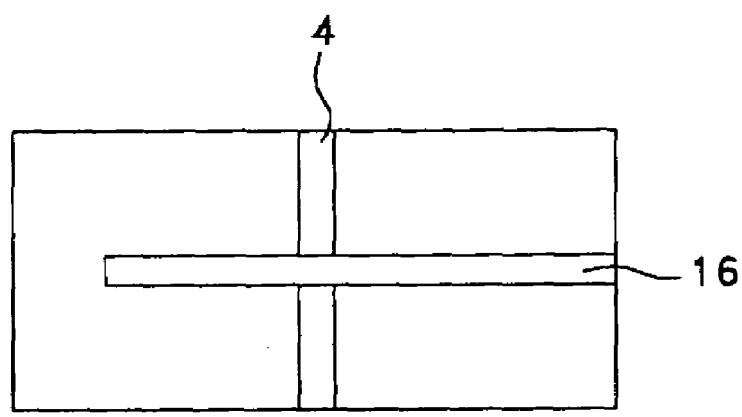

The diagram shows all the essential parts except the metal layers for wiring and FIG. 3b is a plan view of the device.

The basic constitution of the double-gate memory flash memory device according to the present invention comprises of: a bulk silicon substrate (2b); a wall-shape single crystal silicon Fin active region (4) which is formed on the upper section of said bulk silicon substrate (2b) and is connected to said bulk silicon substrate (2b); a second oxide film (10) which is formed on said bulk silicon substrate (2b) and is formed to a certain height of said Fin active region (4); a tunneling oxide film (12) on said second oxide film (10) which is formed on the both side walls of the Fin active region (4); a first oxide film (6) which is formed on the upper surface of said Fin active region (4) with the same or a higher thickness value than that of the tunneling oxide film (12); a storage electrode (32) which is formed on the tunneling oxide film (12), the first and second oxide films (6, 10) in order to store electric charges; an inter-gates oxide film (34) which is formed on said storage electrode (32); a control electrode (16) which is formed on said inter-gates oxide film (34); a source/drain which is formed on the both sides of the Fin active region (4) excluding the Fin active region which overlaps with said control electrode (16); and contact regions (46) and metal layers (48) which are formed at the contact areas of said source, drain, and control electrode (16).

In the above basic constitution, the width of the Fin active region (4) is not constant along the Fin body in vertical direction but the Fin active region (4) is wider near the substrate (2b) than it is away from the substrate, this has the effect of reducing the resistance of the Fin active region (4).

In the above basic constitution, the Fin active region (4) could take the form of a trapezoidal shape which has a narrower width at the top and a wider width at the bottom.

In the above basic constitution, the two corners of the Fin active region (4) could be rounded off by a oxidation process at temperature above 900°° C., an etching process or annealing process in a hydrogen ambient in order to improve the reliability of the device.

In the above basic constitution, the substance of the control electrode (16) could be one of Poly-silicon, Poly-SiGe, and metal.

A first oxide film (6) hard mask which has a width between 4 nm and 100 nm and a thickness between 0.5 nm and 200 nm is formed on the bulk silicon substrate (2b) and a wall shape Fin active region (4) which has the same width with that of the first oxide film (6) hard mask is formed by a dry etching process. The both sides of the Fin active region (4) are formed almost vertically.

Afterwards, further processes to solve the problems arising from plasma etching and the stabilization of a tunneling oxide film (12) are carried out.

For the insulation between a control electrode (16) which is to be formed later and the bulk silicon substrate (2b), a second oxide film (10) with a thickness between 20 nm and 800 nm is formed around the Fin active region (4).

The height of the Fin active region (4) which is protruding from the second oxide film (10) is between 5 nm and 300 nm.

A tunneling oxide film (12) is formed on the both sides of the Fin active region (4) with a thickness between 1 nm and 10 nm. A storage electrode (32) is formed for storing charges.

The storage electrode (32) should be either a conductive or non-conductive material such as a nitride film.

As shown in the fabrication process in FIG. 14, the substance of a storage electrode could be anisotropically etched to form a spacer electrode (36) in the form of a spacer on the both sides of the tunneling oxide film (12). Otherwise the storage electrode is preserved like the storage electrode (32) as shown in FIG. 13a–FIG. 13d without undergoing an anisotropically etching process.

Using an insulating material with a thickness between 1 nm and 30 nm, an inter-gates oxide film (34) is formed on the storage electrode (32 or 36) and above that a control electrode (16) is formed.

In the case of FIG. 13a–FIG. 13d, the storage electrode (32) is left preserved without being anisotropically etched and eventually be defined along with the control electrode (16). Hence, it appears to have nearly same top view as that of the control electrode (16) from the top.

Finally, a storage electrode (32). inter-gates oxide film (34), and control electrode (16) are formed on the both sides of the Fin active region (4) as shown in FIG. 13a–FIG. 13d and FIG. 14a–FIG. 14d. In FIG. 3b, the Fin active region (4) which does not overlaps with the control electrode (16) constitutes a source/drain.

Figure 4A:
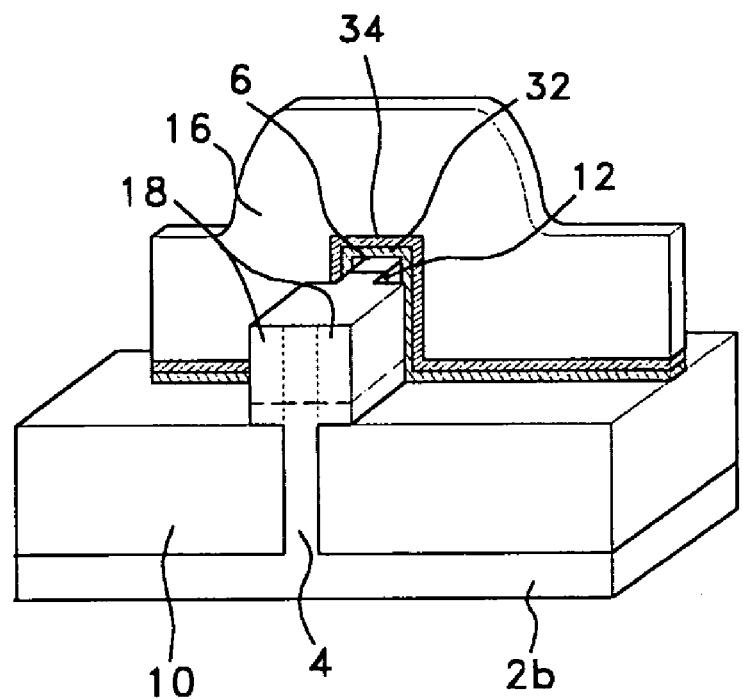
FIG. 4a and FIG. 4b are projected view and plan view, respectively, of the flash memory device according to another embodiment of the present invention.

Since a contact is formed on the area where the source/drain is constituted in the Fin active region (4), and the width of the Fin active region (4) at which is connected to a metal wiring is the same as that of the channel, it has the disadvantage of increasing the parasitic source/drain resistance due to thin Fin width. The parasitic source/drain resistance could be reduced by growing a selective epitaxial layer (18) as shown in FIG. 4a.

The dash-dot line shown in the source/drain region of the Fin active region (4) in FIG. 3a represents the junction depth of the source/drain.

The FIG. 3a shows that the junction depth is located further above the upper surface of the second oxide film (10).

This junction depth could be varied in order to control the short channel effect. If the upper surface of the second oxide film (10) is taken as the base line (0 nm), then the short channel effect could be restrained if the junction depth has a value greater than 0 nm and less than 50 nm above the base line.

On the contrary, if the junction depth has a value greater than −50 nm and less than 0 nm below the base line, then it has the effect of increasing the current driving capability rather than retraining the short channel effect.

FIG. 4a shows one preferred embodiment of the present invention in which a selective epitaxial layer (18) is grown.

After forming the control electrode (16) in the fabrication process, an insulation film is deposited with a thickness between 5 nm and 100 nm. If anisotropically etching is carried out for a etching thickness which corresponds to the thickness of the deposited insulation film and the protruding height of the Fin active region (4) above the upper surface of the second oxide film (10), then the insulation film is only remained near the bottom of the control electrode (16) and around the region where the control electrode (16) and the source/drain region of the Fin active region (4) overlaps, whereas the rest is exposed. Here, the height (thickness) of control gate should be at least thicker than the protruding height of the Fin active region (4) above the upper surface of the second oxide film (10) plus the thickness of the deposited insulation film.

Taking the exposed silicon region of the Fin active region (4) and Poly-silicon region of the control electrode (16) as a seed, a selective epitaxial layer (18) is grown with a thickness between 5 nm and 100 nm.

In this way, an epitaxial layer could be grown on the source/drain region as well as the exposed Poly-silicon region or SiGe gate, and thus resulting a reduction in resistance.

Another method of growing a selective epitaxial layer (18) only on the source/drain region involves the steps of forming a control electrode (16). If the control electrode (16), which is doped over the value of $10^{20}$ cm$^{-3}$ in comparison to the channel doping value which is around $10^{18}$ cm$^{-3}$, is oxidized in wet ambient with a thickness between 5 nm and 20 nm, then three to five times thick oxide film is formed on the control electrode (16) because of higher doping concentration.

If an oxide film which is grown as above method is etched again with reference to the thickness of the oxide film formed on the Fin, then the oxide film formed on the Fin active region (4) disappears and the silicon on the Fin active region (4) is exposed.

In this instance, the oxide film on the control electrode (16) which is relatively thicker than that on the Fin still covers the control electrode (16).

The silicon exposed on the side wall (and top) of the source/drain region of the Fin active region (4) is used as a seed to grow a selective epitaxial layer (18).

The substance of the selective epitaxial layer (18) in this instance could be single crystal silicon, single crystal SiGe, Poly-silicon, or Poly-SiGe.

FIG. 5a–FIG. 5d shows the masking sequence necessary for forming the structure as shown in FIG. 3a.

Figure 5A:
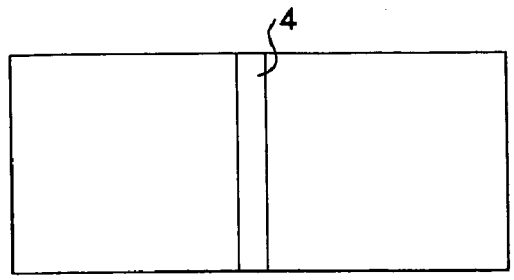
FIG. 5a through FIG. 5d are plan views which show the masking sequence necessary for forming the structure in FIG. 3a and FIG. 3b.
Figure 5B:
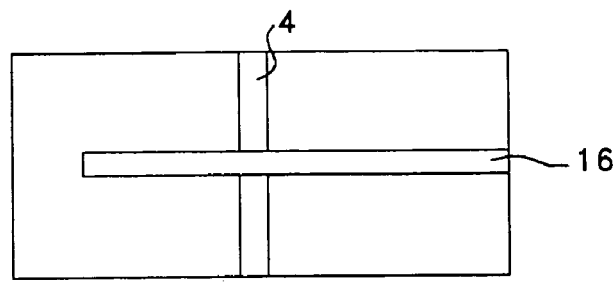

FIG. 5a shows the formation of a Fin active region (4) and FIG. 5b shows the formation of a control electrode (16).

Figure 5C:
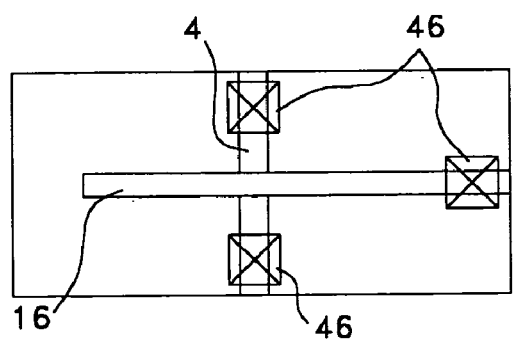
Figure 5D:
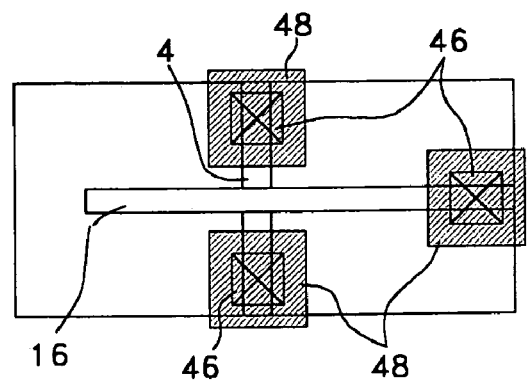

FIG. 5c shows contact regions (46) for source/drain contacts and FIG. 5d shows a metal layer (48) connection for wiring.

The contact resistance could be reduced by forming a contact region, which is in connection with the metal layer (48), to be larger than the width of the Fin active region (4) or the length of the control electrode (16), and also by creating contacts with the metal layers (48) located on the upper sections and side walls of the control electrode (for gate) (16) and Fin active region (for source/drain) (4).

Figure 6:
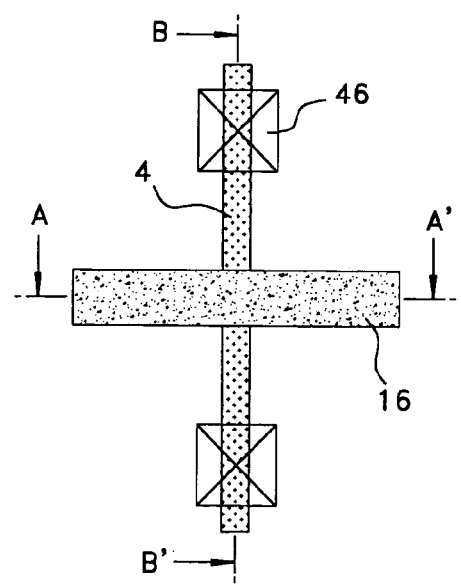
FIG. 6 shows cross-section diagrams of the proposed structure as shown in FIG. 3a and FIG. 3b along the horizontal and vertical directions with reference to the channel.
Figure 6:
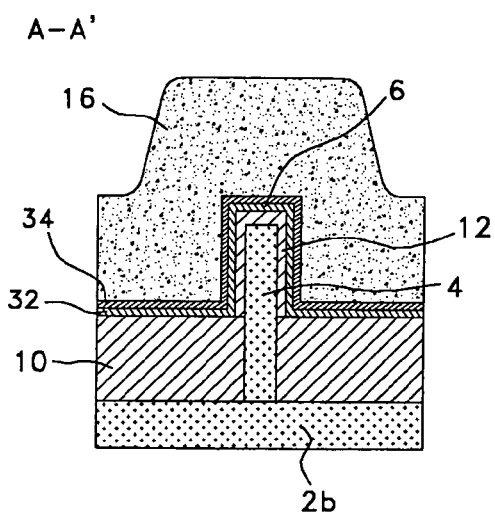
Figure 6:
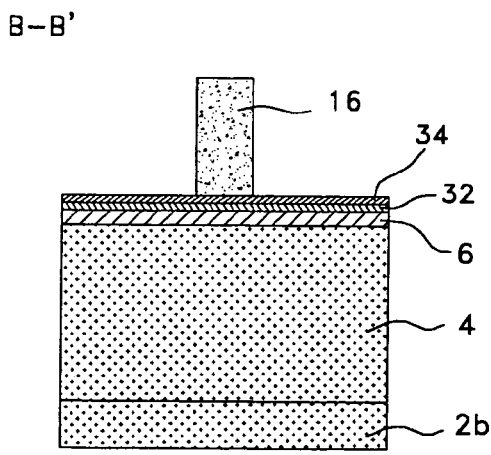

FIG. 6 shows cross-section diagrams of the proposed structure as shown in FIG. 3a and FIG. 3b along the horizontal and vertical directions with reference to the channel.

In this case, the resistance is large since the width of the source/drain region is the same as that of a thin Fin active region (4).

The contact region (46), which is shown at center upper end, is utilized for electrically connecting a source/drain which is formed on the Fin active region (4).

Figure 4B:
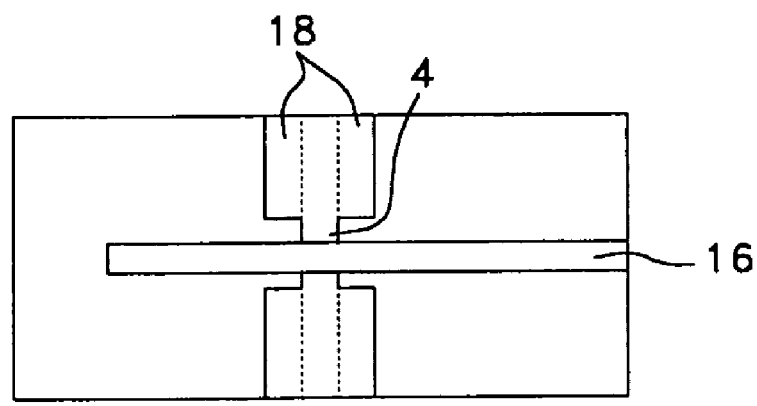
Figure 7:
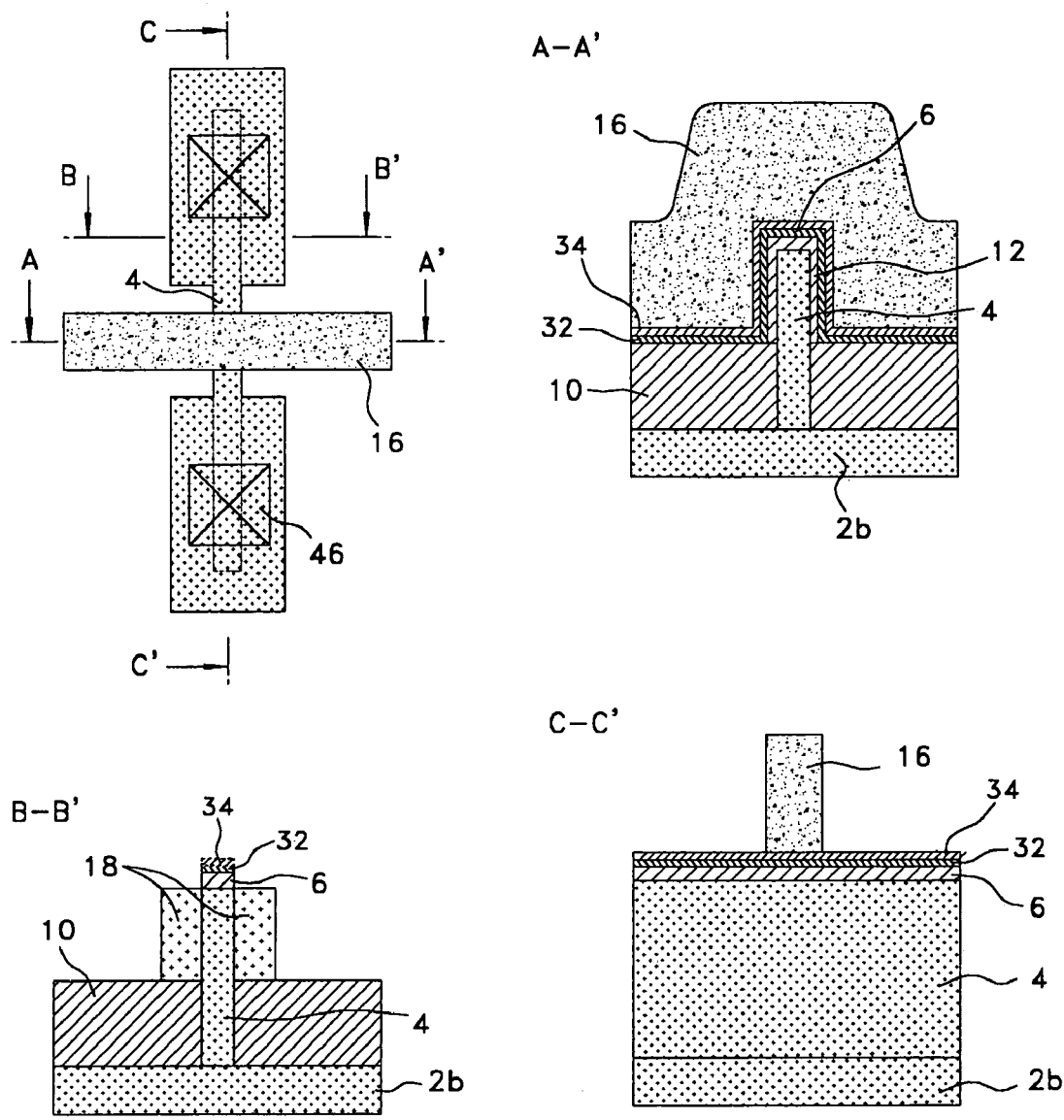
FIG. 7 shows cross-section diagrams of the proposed structure as shown in FIG. 4a and FIG. 4b along the horizontal and vertical directions with reference to the channel.

FIG. 7 shows cross-section diagrams of a structure, along the horizontal and vertical directions with reference to the channel, in which a selective epitaxial layer (18) is grown in the source/drain of the Fin active region (4) of the structure as shown in FIG. 4a and FIG. 4b.

As can be seen from the cross-section (B–B') at lower left end, a selective epitaxial layer (18) is formed on the both side walls of the Fin active region (4).

The selective epitaxial layer (18) could be formed not only on the both side walls of the Fin active region (4) but also on the upper surface if the stack (6, 32, 34) is removed.

Unlike the Fin active region (4), the width of the source/drain region is enlarged through the formation of a selective epitaxial layer (18), resulting a reduction in the parasitic source/drain resistance.

The contact region (46), which is represented by boxes with cross mark, is utilized for electrically connecting the source/drain which is formed on the Fin active region (4) to the metal (48) layer.

Hereinafter, 2-dimensional diagrams will be used for illustrating the Fin body of the proposed structure according to the present invention instead of 3-dimensional diagrams. The channel of the device is formed in the Fin body. A 2-dimensional cross-section diagram will be used for illustrating the essential part at which the channel and control electrode meets.

FIG. 8a–FIG. 8d is cross-section diagrams which show the essential fabrication process for the Fin body of a flash memory device using Chemical Mechanical Polishing (CMP) according to first preferred embodiment of the present invention.

Figure 8A:
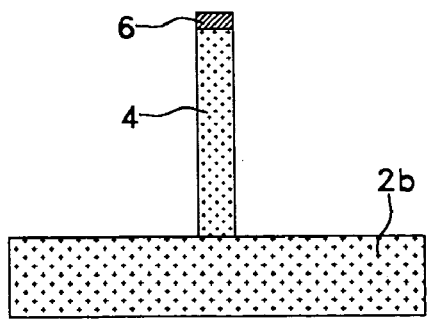
FIG. 8a through FIG. 8d are cross-section diagrams which show the essential fabrication process for the Fin body of a flash memory device according to first preferred embodiment of the present invention.

FIG. 8a is a 2-dimensional diagram which shows a first oxide film (6) formed on a bulk silicon substrate (2b) and afterwards, a patterned the first oxide film (6) and an etched bulk silicon substrate (2b) using the oxide film (6) as a hard mask. From the etching process, the Fin body (4) is formed.

Afterwards, the channel Fin which is connected to the bulk silicon substrate (2b) is formed along with the Fin active region (4).

In this instance, the thickness of the first oxide film (6) is between 0.5 nm and 200 nm. The height of the Fin active region (4) is between 10 nm and 1000 nm and the width is between 4 nm and 100 nm.

Figure 8B:
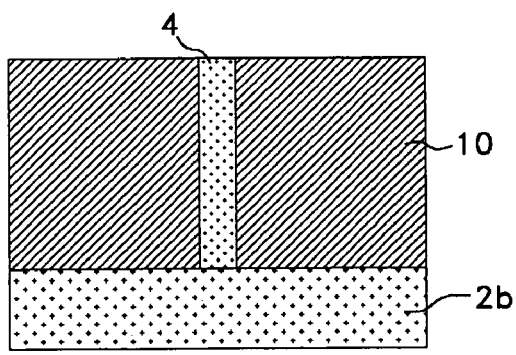

FIG. 8b is a cross-section diagram which shows an etched second oxide film (10) using CMP after forming a second oxide film (10) on the structure in FIG. 8a with a thickness between 20 nm and 1000 nm, more preferably between 20 nm and 800 nm.

Figure 8C:
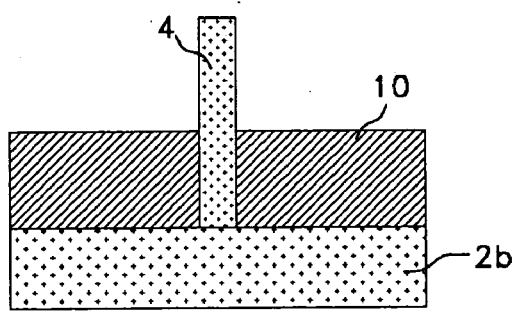

FIG. 8c is a cross-section diagram which shows an etched second oxide film (10) with a thickness between 10 nm and 950 nm.

Finally, the height of the protruding Fin active region (4) above the second oxide film (10) is between 5 nm and 300 nm.

Figure 8D:
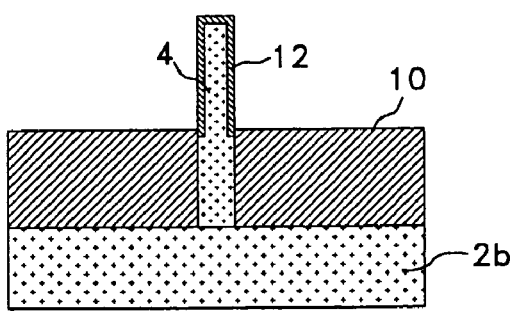

FIG. 8d is a cross-section diagram which shows a tunneling oxide film (12) formed on the Fin active region (4) with a thickness between 0.5 nm and 10 nm.

Before forming the tunneling oxide film (12), the side walls of the protruding Fin active region (4) are cleaned and a sacrificial oxide film can be grown in order to remove the damages due to the preprocessing. Afterwards, the sacrificial oxide film is removed and preferably an annealing process is carried out in a Nitrogen or Argon ambient.

In the post processing, one of Poly-silicon (p+ or n+ doping), SiGe (p+ or n+ doping), and metal is used as a control electrode (16).

An oxide film for isolation between the control electrode (16) and the metal layer (48) is formed through a suitable heat treatment and if necessary, the oxide film is formed through a deposition process.

A photolithography process is carried out for formation of a contact region (46).

A metal layer (48), which is used for electrically connecting the source/drain and the control gate (16) to suitable interconnection lines, is deposited and metal wiring is formed through photolithography.

FIG. 9a–FIG. 9d shows the essential fabrication process for the Fin body of a flash memory device using Chemical Mechanical Polishing (CMP) according to second preferred embodiment of the present invention.

Figure 9A:
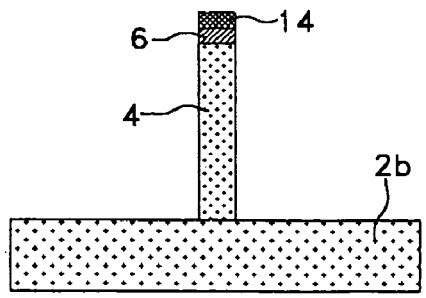
FIG. 9a through FIG. 9d are cross-section diagrams which show the essential fabrication process for the Fin body of a flash memory device according to second preferred embodiment of the present invention.

FIG. 9a shows an etched profile of the first oxide film (6), nitride film (14) and bulk silicon substrate (2b) after nano-scale patterning of an oxide film (6) and nitride film (14) formed on the bulk silicon substrate (2b). Here, the bulk silicon substrate (2b) is formed through the etching using the patterned the first oxide film (6) and nitride (14) as a hard mask.

The nitride film (14) is used as an etch stopper for CMP and its thickness is between 10 nm and 200 nm.

In this instance, the thickness of the first oxide film (6) is between 0.5 nm and 200 nm. The height of the Fin active region (4) is between 10 nm and 1000 nm.

Figure 9B:
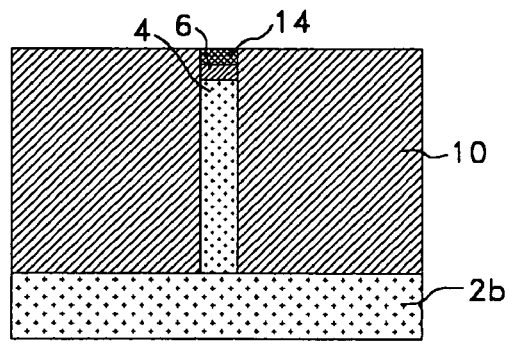

FIG. 9b is a cross-section diagram which shows an etched second oxide film (10) using CMP after forming a second oxide film (10) on the structure in FIG. 9a with a thickness between 20 nm and 1000 nm, more preferably between 20 nm and 800 nm.

Figure 9C:
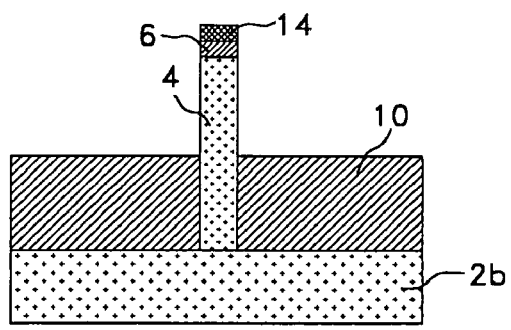

FIG. 9c is a cross-section diagram which shows an etched second oxide film (10) that is formed in FIG. 9b with a thickness between 10 nm and 950 nm.

Finally, the height of the protruding Fin active region (4) above the second oxide film (10) is between 5 nm and 300 nm.

Figure 9D:
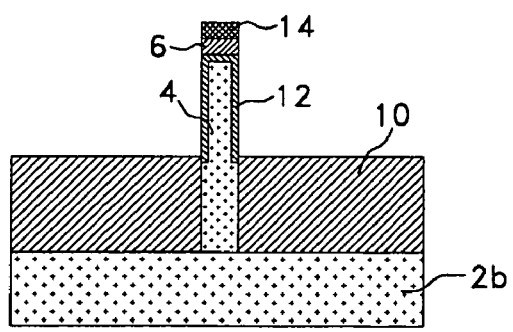

FIG. 9d is a cross-section diagram which shows a tunneling oxide film (12) formed on the Fin active region (4) with a thickness between 0.5 nm and 10 nm.

Here, the tunneling oxide film (12) could be grown after removing the nitride film (14).

Before forming the tunneling oxide film (12), the side walls of the protruding Fin active region (4) are cleaned and a sacrificial oxide film can be grown in order to remove the damages due to the preprocessing. Afterwards, the sacrificial oxide film is removed and preferably an annealing process can be carried out in a Nitrogen or Argon ambient.

In the post processing, one of Poly-silicon (p+ or n+ doping), SiGe (p+ or n+ doping), and metal is used as a control electrode (16).

An oxide film for isolation between the control electrode (16) and the metal layer (48) is formed through a suitable heat treatment and if necessary, the oxide film is formed through a deposition process.

A photolithography process is carried out for formation of a contact region (46).

A metal layer (48), which is used for electrically connecting the source/drain and the control gate (16) to suitable interconnection lines, is deposited and metal wiring is formed through photolithography.

FIG. 10a–FIG. 10d shows the essential fabrication process for the channel forming body of a flash memory device using the selective epitaxial growing method for forming a fin active region according to third preferred embodiment of the present invention.

Figure 10A:
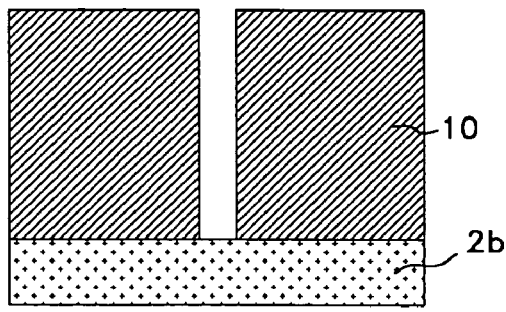
FIG. 10a through FIG. 10d are cross-section diagrams which show the essential fabrication process for the Fin body of a flash memory device according to third preferred embodiment of the present invention.

FIG. 10a shows the cross-section of the etched second oxide film after forming a second oxide film (10) on the bulk silicon substrate (2b) with a thickness between 20 nm and 1000 nm and carrying out a nano-scale patterning.

Here, the width of the etched second oxide film (10) is between 4 nm and 100 nm and the depth is between 10 nm and 1000 nm.

Taking the exposed silicon region of the exposed bulk silicon substrate on the etched oxide film at the trench floor as a seed, a selective epitaxial layer with a suitable height is grown in order to form a Fin active region (4).

Here, the width of the second oxide film (10) is between 4 nm and 100 nm. The depth is between 10 nm and 1000 nm.

A first oxide film (6) with a thickness between 0.5 nm and 200 nm is formed on the Fin active region (4) and above that a nitride film (14) with a thickness between 10 nm and 200 nm is formed.

Figure 10B:
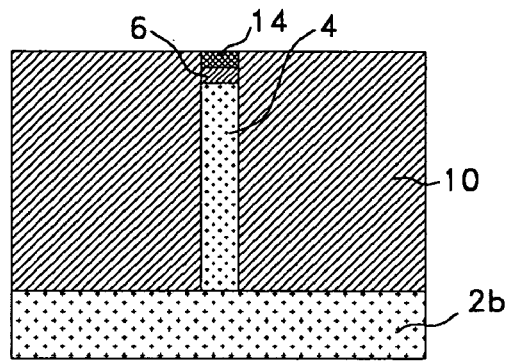

FIG. 10b shows a cross-section after etching a thickness value which is equivalent to the deposition thickness of the nitride film (14) and the first oxide film (6) using CMP or dry etching.

Figure 10C:
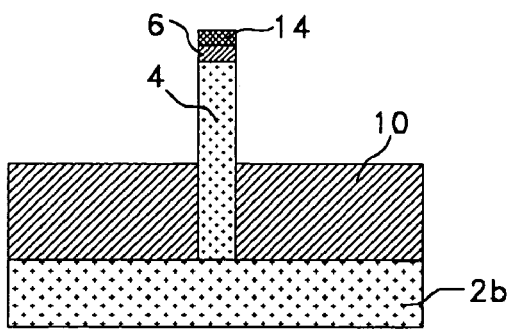

FIG. 10c shows a cross-section after etching the second oxide film (10) with thickness between 10 nm and 950 nm is formed.

Finally, the height of the protruding Fin active region (4) above the second oxide film (10) is between 5 nm and 300 nm.

Figure 10D:
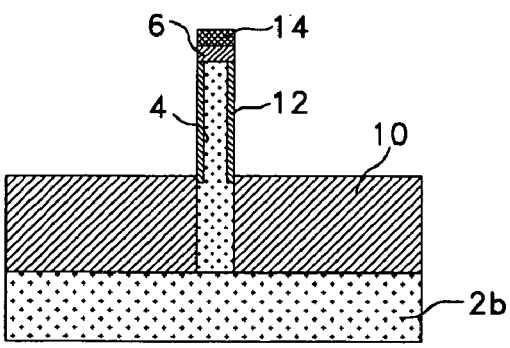

FIG. 10d is a cross-section diagram which shows a tunneling oxide film (12) formed on the Fin active region (4) with a thickness between 0.5 nm and 10 nm.

Here, the tunneling oxide film (12) could be grown after removing the nitride film (14).

Before forming the tunneling oxide film (12), the side walls of the protruding Fin active region (4) are cleaned and a sacrificial oxide film can be grown in order to remove the damages due to the preprocessing. Afterwards, the sacrificial oxide film is removed and preferably an annealing process can be carried out in a Nitrogen or Argon ambient.

The next post processing steps are identical to the post processing steps shown in FIG. 8d and FIG. 9d.

FIG. 11a–FIG. 11d shows the essential fabrication process for the channel forming body of a flash memory device using the growth of a field oxide film (28) for forming the final desired structure instead of Chemical Mechanical Polishing (CMP) according to fourth preferred embodiment of the present invention.

Here, the essential fabrication processes of forming the final desired structure by adopting the methods of forming a spacer oxide film (26) and growing a field oxide film (28) will be described.

Figure 11A:
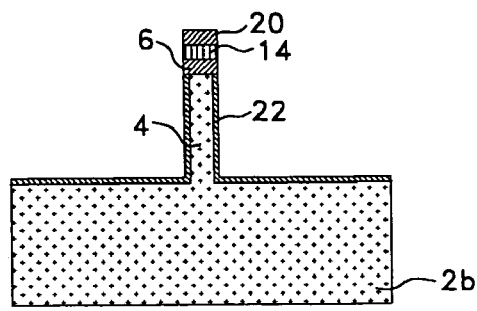
FIG. 11a through FIG. 11d are cross-section diagrams which show the essential fabrication process for the Fin body of a flash memory device according to fourth preferred embodiment of the present invention.

As shown in FIG. 11a, a Fin active region (4) is formed through a photolithography process after a first oxide film (6) with a thickness between 0.5 nm and 200 nm is formed and above that a nitride film (14) with a thickness between 10 nm and 200 nm is formed and again above that a third oxide film (20) with a thickness between 5 nm and 500 nm is formed.

After patterning the third oxide film (20), nitride film (14), and first oxide film (6) through a photolithography, and bulk silicon substrate (2b) is etched using the film stack (20, 14, 6) as a hard mask. Then a buffer oxide layer (22) is grown as shown in FIG. 11a.

The height of the Fin active region (4) becomes between 10 nm and 1000 nm.

In this state, a thin buffer oxide film (22) is formed with a thickness between 1 nm and 50 nm and above that an oxidation prevention nitride film (24) is formed with a thickness between 5 nm and 100 nm.

On top of that, a spacer oxide film (26) is again formed with a thickness between 5 nm and 500 nm. If anisotropic etching is carried out, then an oxide film in the shape of a spacer is formed.

Figure 11B:
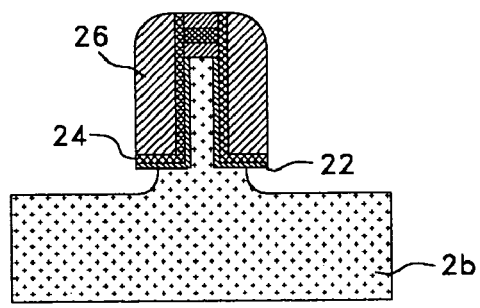

If the silicon of the bulk silicon substrate (2b) is etched isotropically with a thickness between 30 nm and 300 nm, then the cross-section structure in FIG. 11b is obtained.

Figure 11C:
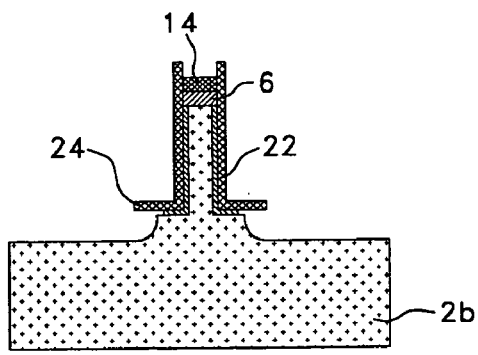

Here, if the oxide films (20, 22, 26) are selectively etched, the structure becomes as shown in FIG. 11c.

Figure 11D:
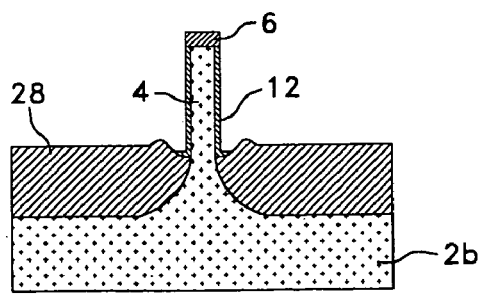

In this state, a field oxide film (28) is formed with a thickness between 30 nm and 500 nm and the nitride films (14, 24) are removed, then the cross-section structure in FIG. 11d is obtained.

Finally, the height of the protruding Fin active region (4) above the field oxide film (28) is between 5 nm and 300 nm.

FIG. 11d shows a cross-section of a tunneling oxide film (12) which is formed on the Fin active region (4).

Before forming the tunneling oxide film (12), the side walls of the protruding Fin active region (4) are cleaned and a sacrificial oxide film can be grown in order to remove the damages due to the preprocessing. Afterwards, the sacrificial oxide film is removed and preferably an annealing process can be carried out in a Nitrogen or Argon ambient.

The next post processing steps are identical to the post processing steps shown in FIG. 8d, FIG. 9d and FIG. 10d.

FIG. 12a–FIG. 12d shows the essential fabrication process for the Fin body of a flash memory device using the technology of forming a spacer (30) and growing a field oxide film (28) according to fifth preferred embodiment of the present invention.

In comparison to FIG. 11a–FIG. 11d, the only difference is the substance which forms the spacer (30).

Figure 12A:
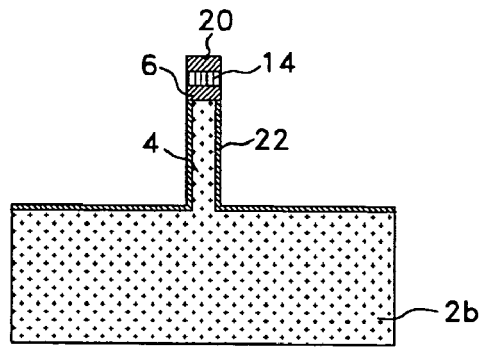
FIG. 12a through FIG. 12d are cross-section diagrams which show the essential fabrication process for the Fin body of a flash memory device according to fifth preferred embodiment of the present invention.

As shown in FIG. 12a, a Fin active region (4) is formed through a photolithography process on the bulk silicon substrate (2b), after a first oxide film (6) with a thickness between 0.5 nm and 200 nm is formed and above that a nitride film (14) with a thickness between 10 nm and 200 nm is formed and again above that a third oxide film (20) with a thickness between 5 nm and 500 nm is formed.

After patterning the third oxide film (20), nitride film (14), and first oxide film (6) through a photolithography, and bulk silicon substrate (2b) is etched using the film stack (20, 14, 6) as a hard mask. Then a buffer oxide layer (22) is grown as shown in FIG. 12a.

The height of the Fin active region (4) becomes between 10 nm and 1000 nm.

In this state, a thin buffer oxide film (22) is formed with a thickness between 1 nm and 50 nm and above that an oxidation prevention nitride film (24) is formed with a thickness between 5 nm and 100 nm.

On top of that, Poly-silicon or amorphous silicon for spacer material is formed with a thickness between 5 nm and 500 nm and if anisotropical etching is carried out, then a spacer (30) is formed.

Figure 12B:
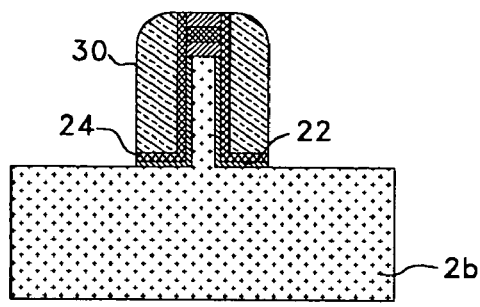

This structure is shown in FIG. 12b and the spacer (30) in FIG. 12b is different from the spacer oxide film (26) in FIG. 11b.

In FIG. 12b, Poly-silicon or amorphous silicon is used for the spacer material. This is due to the fact that when the spacer oxide film (26) is etched in FIG. 11b, the buffer oxide film (22) underneath the nitride film (24) is also being etched away causing an adverse effect to the growth of the field oxide film later on.

Also, the Poly-silicon or amorphous silicon could be doped in high concentration.

Figure 12C:
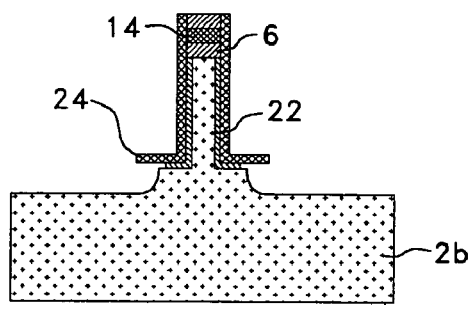

If the exposed spacer (30) and bulk silicon substrate (2b) in FIG. 12b are etched with a thickness between 30 nm and 300 nm, then the cross-section structure in FIG. 12c is obtained.

Figure 12D:
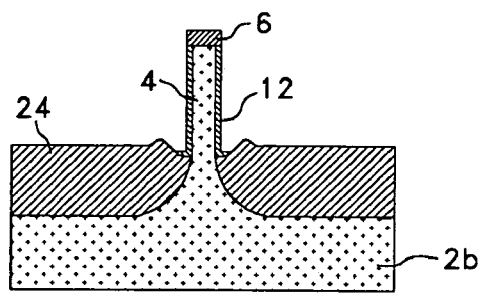

In this state, a field oxide film (28) is formed with a thickness between 30 nm and 500 nm and the nitride films (14, 24) are removed, then the cross-section structure in FIG. 12d is obtained.

Finally, the height of the protruding Fin active region (4) above the field oxide film (28) is between 5 nm and 300 nm.

FIG. 12d shows a cross-section of a tunneling oxide film (12) which is formed on the Fin active region (4).

Before forming the tunneling oxide film (12), the side walls of the protruding Fin active region (4) are cleaned and a sacrificial oxide film can be grown in order to remove the damages due to the preprocessing. Afterwards, the sacrificial oxide film is removed and preferably an annealing process can be carried out in a Nitrogen or Argon ambient.

The next post processing steps are identical to the post processing steps shown in FIG. 8d, FIG. 9d, FIG. 10d and FIG. 11d.

From FIG. 8a–FIG. 8d to FIG. 12a–FIG. 12d shows the fabrication process of forming the regions (2, 4, 6, 10, 12) which correspond to the Fin body of a flash memory device according to the present invention, hereinafter, the processes of forming a flash memory device based on the above structures will be described.

FIG. 13a–FIG. 13d shows the essential fabrication processes for forming a flash memory device as shown in FIG. 3a and FIG. 3b.

Figure 13A:
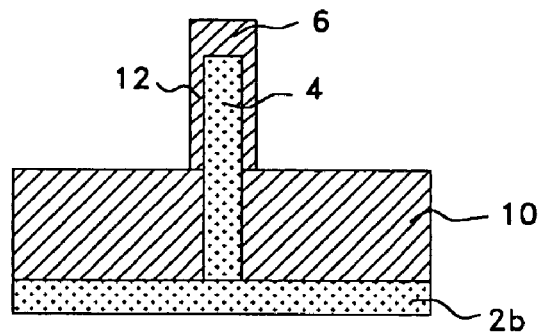
FIG. 13a through FIG. 13c show the essential fabrication process and structure for forming a flash memory device according to sixth preferred embodiment of the present invention.

FIG. 13a is identical to the structure in FIG. 8d, and also identical to the structures in FIG. 9d and FIG. 10d without the nitride film (14).

Figure 13B:
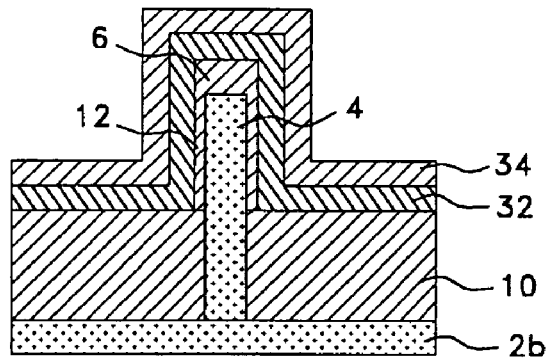

In FIG. 13b, a storage electrode (32) which could store electrical charges through a program is formed with a thickness between 1 nm and 400 nm and an inter-gates oxide film is formed between the storage electrode (32) and control electrode (16) with a thickness between 1 nm and 30 nm.

Here, the storage electrode (32) is called a floating electrode. The possible substances for the storage electrode (32) include Poly-silicon (n+ or p+ doping), nitride film with a trap, Poly-SiGe, and metal.

In case of using the nitride film with a trap for the storage electrode (32), this is called a SONOS type flash memory device structure. The storage electrode (32) in this case can be very thin.

Figure 13C:
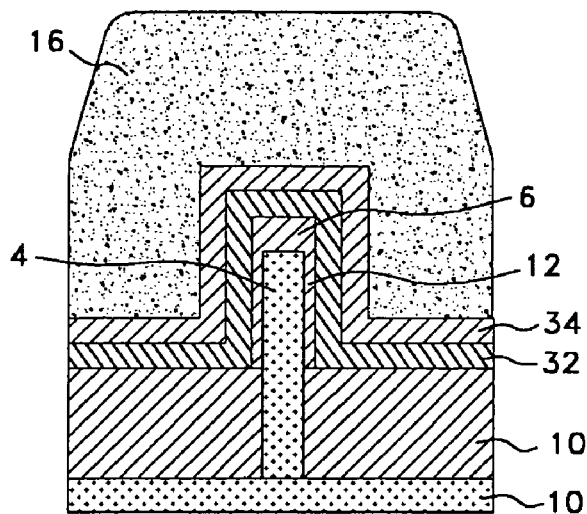

FIG. 13c shows the cross section including a control electrode (16).

Since the storage electrode (32) has the same top view with the control electrode (16) and they overlap each other as much as the area of the control electrode (16), as shown in FIG. 13a–FIG. 13d, the capacitance between the two electrodes (32, 16) become very large and this has the advantage of being able to reduce the writing voltage significantly for storing charges.

Likewise, a device with superior performance could be obtained without the complexity required for the conventional CMOS device technology in the fabrication process. Also, no extra masks are necessary for forming the essential parts of the device.

FIG. 14a–FIG. 14d shows the essential fabrication processes and structures of a double-gate flash memory device which has a spacer type storage electrode.

Figure 14A:
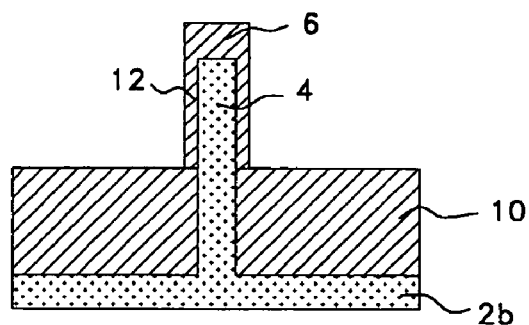
FIG. 14a through FIG. 14c show the essential fabrication process and structure for forming a flash memory device according to seventh preferred embodiment of the present invention.

FIG. 14a is identical to the structures in FIG. 8d, and also identical to the structures in FIG. 9d and FIG. 10d without the nitride film (14).

Figure 14B:
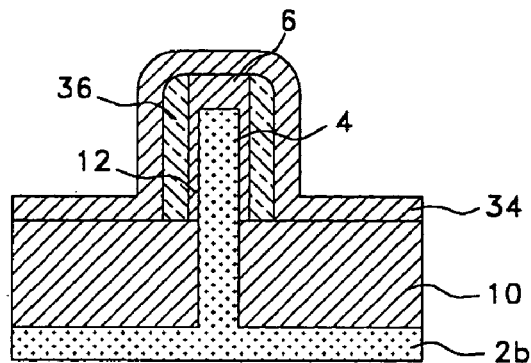

In FIG. 14b, a spacer storage electrode (36) which could store electrical charges through a program is formed with a thickness between 1 nm and 400 nm and an inter-gates oxide film (34) is formed between the storage electrode (36) and control electrode (16) with a thickness between 1 nm and 30 nm.

Here, the spacer storage electrode (36) is called a floating electrode. The possible substances for the spacer storage electrode (36) include Poly-silicon (n+ or p+ doping), nitride film with a trap, Poly-SiGe, and metal.

In case of using the nitride film with a trap for the spacer storage electrode (36), this is called a SONOS type flash memory device structure. The spacer storage electrode (36) in this case can be very thin.

Figure 14C:
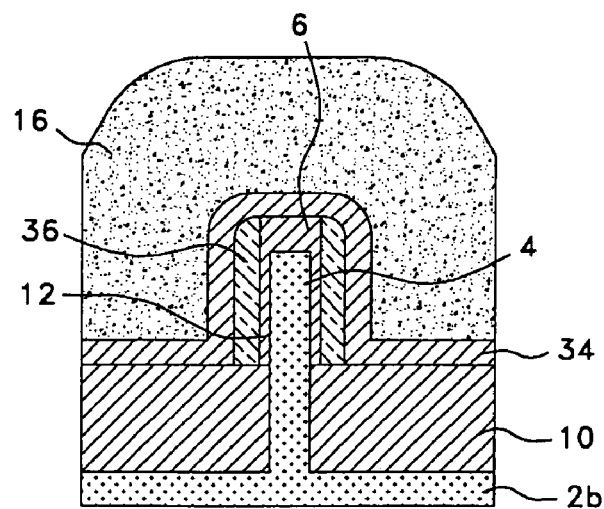

FIG. 14c shows the cross section including a control electrode (8).

In FIG. 14a–FIG. 14d, the electrodes (36) located on the both side walls of the Fin active region are electrically isolated and store charges independently.

For example, if the charges in one spacer storage electrode are leaked, the charges on the other spacer storage electrode are preserved in order to maintain the characteristic of the program.

As can be seen in FIG. 13a–FIG. 13d, if the substance of the storage electrodes (32) formed on the both side walls of the Fin active region is a conductive material, then contrary to the what has been said with reference to FIG. 14a–FIG. 14d, the memory characteristic would immediately be lost if any problem occurs on one of the side walls because the storage electrodes (32) are electrically connected to each other.

If the storage electrodes (32) are formed by nitride films as in the case of the SONOS type flash memory device structure, then if any problem occurs on one of the storage nodes, it does not become a problem as a whole since the two electrodes are electrically isolated.

Likewise, if the storage electrodes (32) are formed by nitride films, the storage electrodes (32) cause no significant problem in terms of electrical characteristics and process irrespective of whether the storage electrodes only exist under the control electrode (16) or on the whole surface.

The structure of the flash memory device in FIG. 14 also has a simple fabrication process.

Unlike the structure of a conventional memory device, the structure of the flash memory device as shown in FIG. 13a–FIG. 13d and FIG. 14a–FIG. 14d has the storage electrodes (32, 36) on the both vertical side walls (and top region) of the Fin active region (4), hence, it is called a double-gate flash memory device.

Using the double-gate structure, the short channel effect of a device could be significantly improved. As a result, the gate length of a device could be reduced below 50 nm, hence, significantly improving the integration density.

Also, it could reduce the fabrication cost since a bulk wafer instead of a SOI wafer could be utilized.

Since the Fin active region (4) which becomes the channel of a device is connected to a bulk silicon substrate (2b), the floating body effect which occurs in the conventional SOI devices could be eradicated. Also, the leakage current problem due to the parasitic bipolar effect could completely be removed.

Moreover, the heat generated from the device could easily be transferred to the bulk silicon substrate (2b) since the Fin active region (4) is connected to the bulk silicon substrate (2b), therefore, the operation characteristic of the device could be improved.

If the substance of the storage electrodes (32, 36) are formed by an insulating material such as nitride films for the SONOS type flash memory device, then retention characteristic becomes superior in comparison to the memory device which is formed by a conductive storage electrode since the programmed charges could not easily escape the Fin active region (4) due to the problems of the tunneling oxide film (12) or the bias condition.

The fabrication process is simpler in comparison to the case where a conductive storage electrode is formed.

If this SONOS type flash memory device is compared to the conventional devices, the conventional devices have problems on the scaling down characteristic due to the following reasons.

Figure 1A:
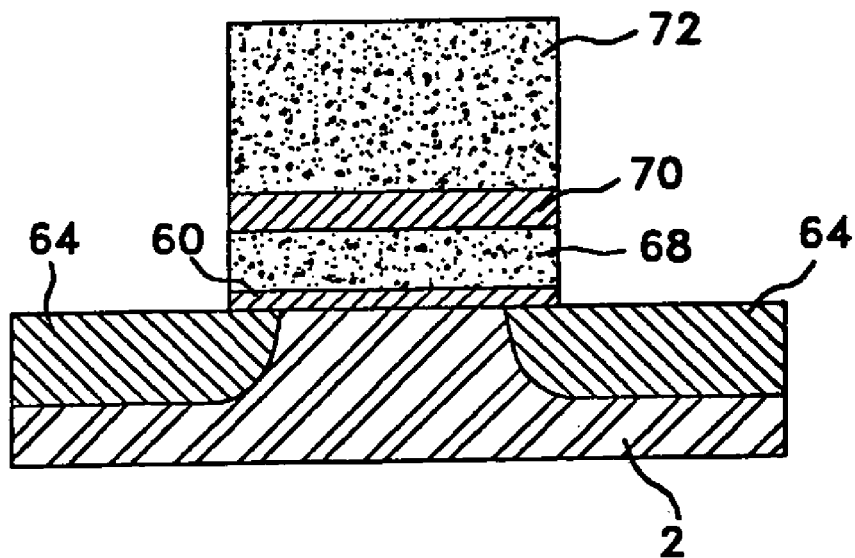
FIG. 1a and FIG. 1b show an example of scaling down of a conventional flash memory device.
Figure 1B:
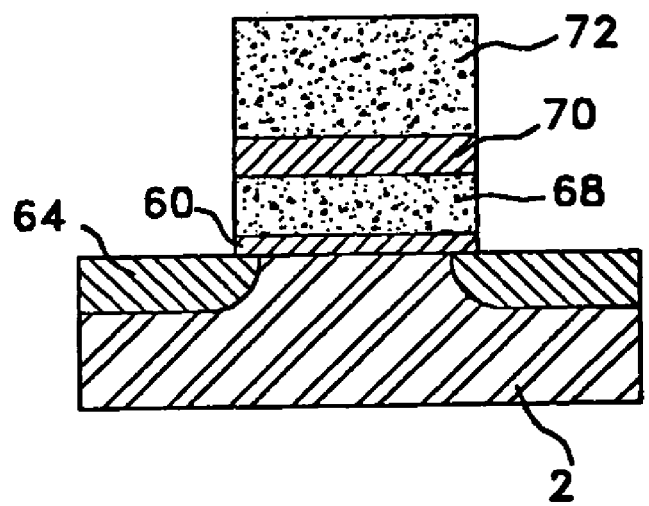
Figure 2A:
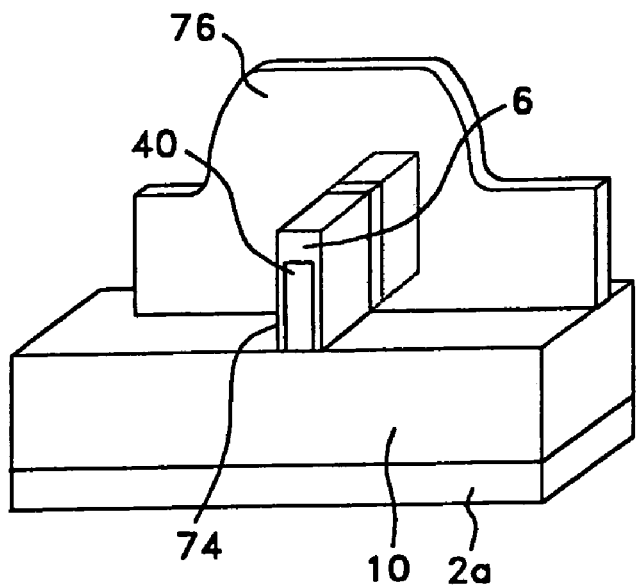
FIG. 2a and FIG. 2b show the conventional Fin FEET device either in a transparent or non-transparent diagram.
Figure 2B:
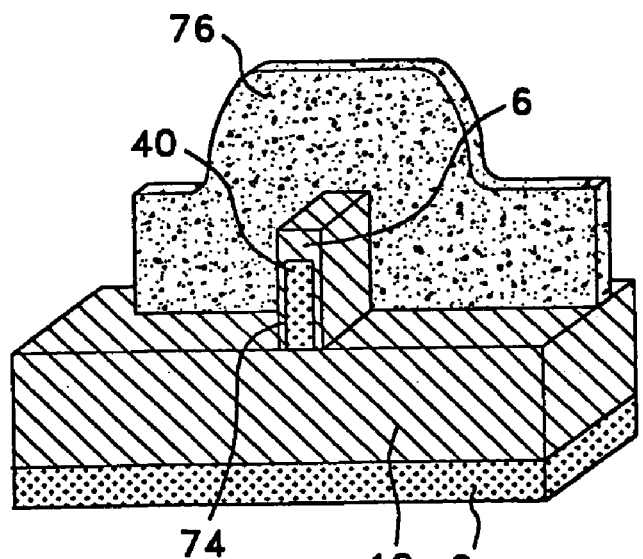

First of all, if the storage electrode (68) is assumed to be made of nitride film in FIG. 1a and FIG. 1b, this becomes immediately the structure of a SONGS type flash memory device.

Since the gate insulation film in the conventional SONOS type flash memory structure is an oxide-nitride-oxide (ONO) structure, the thickness of an equivalent gate insulation film could not be reduced below that of the conventional MOS device, hence, there is a limit in reducing the channel length of the device.

In other words, the thickness of gate oxide film should be reduced to achieve reasonable scaling down of the device, hence, restraining the short channel effect. However, this is not possible in the conventional SONOS structure.

Also, if the channel length and width of the conventional SONOS type flash memory are less than 100 nm, then the trap density of the nitride film, which stores the tunneling charges during programming, could be non-uniformly formed throughout the wafer, resulting large variations of threshold voltage of the device according to its location.

In order to resolve this problem, the channel length and width of the device should be maintained above a certain value, resulting in deterioration in the integration density of the memory. It is well known that the effect from the trap non-uniformity is reduced with the increased gate area (width and length).

However the proposed structures in FIG. 3a and FIG. 3b, FIG. 13a–FIG. 13d and FIG. 14a–FIG. 14d in the present invention have a double-gate structure, as a result, their scaling down characteristic is comparatively better than the conventional bulk structure.

Also, the height of the wall shape Fin active region (4) where the channel is formed is increased, the area with which the storage electrode (32) covers the channel increases without increasing the previously mentioned 2-dimensional area. Since the storage electrode (32) is formed on the both sides (and the top region) of the channel, the area with which the storage electrode (32) covers relatively increases, hence, the previously mentioned problem of non-uniformity in the trap density could much be reduced without increasing 2-dimensional gate area, which leads to high integration density.

FIG. 15a–FIG. 15d shows the flash memory structure and fabrication process which is similar to FIG. 13a–FIG. 13d.

Figure 15A:
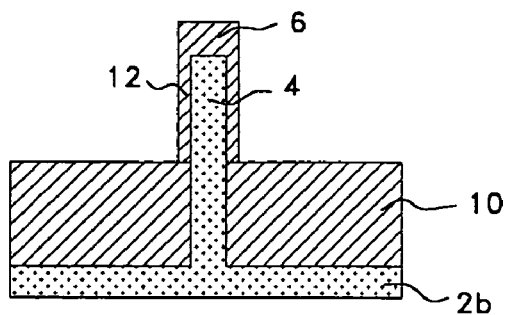
FIG. 15a through FIG. 15c show the essential fabrication process and structure for forming a flash memory device according to eighth preferred embodiment of the present invention.

FIG. 15a is identical to the structure in FIG. 8d, and also identical to the structures in FIG. 9d and FIG. 10d without the nitride film (14).

Figure 15B:
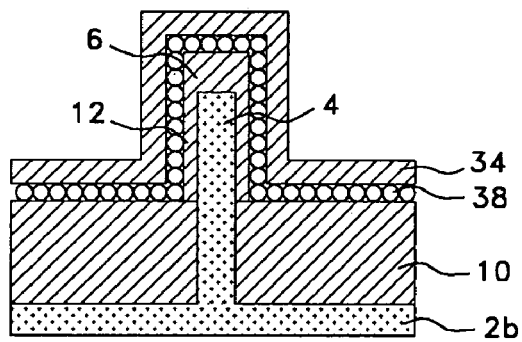

In FIG. 15b, nano-crystal or quantum dot is used as a storage electrode (38) for storing electrical charges through a program.

Here, the storage electrode (38) is called a floating electrode.

The possible substances for the storage electrode (38) could be nano-crystal such as poly-silicon (n+ or p+ doping), poly-SiGe, and metal.

Figure 15C:
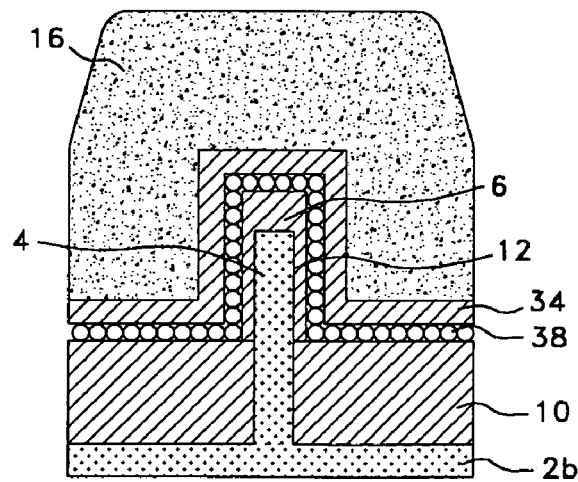

FIG. 15c shows the cross section including a control electrode (16).

This structure provides a device with superior performance which could be obtained without the complexity required for the fabrication of the conventional CMOS device technology. Also, no extra masks are necessary for forming the essential parts of the device.

In case when quantum dot is used for the storage electrode (38), the space between two neighboring dots are electrically insulated, hence, although some charges on any dot might escape the channel, the rest are preserved, resulting an improvement in the memory retention characteristic.

Likewise, the present invention provides a device structure which enhances the integration density of a flash memory device, additional superior program, retension and reliability characteristics. At the same time, the leakage current and heat transfer problems could be resolved since the Fin active region (4) is connected to the bulk silicon substrate (2b).

Likewise, the present invention provides a double-gate flash memory device structure with a superior scaling down characteristic.

Also, the present invention, apart from the superiority in the integration density, the storage electrode which is formed on the both side walls (and the top region) of the Fin active region (4) shows a good threshold voltage variation even though the charges on one of the storage electrodes decrease, resulting a superior memory performance.

The cost could be reduced by using a bulk silicon wafer instead of a SOI wafer, and the problems such as the floating body effect, leakage current and bad heat conduction in a conventional SOI type flash memory device could be resolved.

What is claimed is:

1. A double-gate flash memory device, comprising:
   a bulk silicon substrate;
   a wall-shape single crystal silicon Fin active region which is vertically formed from a portion of said bulk silicon and is connected to said bulk silicon substrate;
   a second oxide film which is formed on said bulk silicon substrate and is formed to a certain height of said Fin active region;
   a tunneling oxide film on said second oxide film which is formed on the both side walls of the Fin active region;
   a first oxide film which is formed on the upper surface of said Fin active region with nearly same or a thicker thickness value than that of the tunneling oxide film;
   a storage electrode which is formed on the tunneling oxide, the first and second oxide films in order to store electric charges; an inter-gates oxide film which is formed on said storage electrode;
   a control electrode which is formed on said inter-gates oxide film;
   a source/drain which is formed on the both sides of the Fin active region excluding the Fin active region which overlaps with said control electrode; and
   contact regions and metal layers which are formed at the contact areas of said source, drain, and control electrode.

2. The device as claimed in claim 1, wherein the width of said Fin active region is between 4 nm and 100 nm.

3. The device as claimed in claim 1, wherein the height of said Fin active region from the surface of the bulk silicon substrate is between 10 nm and 1000 nm.

4. The device as claimed in claim 3, wherein the height of said Fin active region from the surface of the second oxide film is between 5 nm and 300 nm.

5. The device as claimed in claim 1, wherein the thickness of said tunneling oxide film is between 0.5 nm and 10 nm, and the thickness of said first oxide film is between 0.5 nm and 200 nm.

6. The device as claimed in claim 1, wherein the thickness of said second oxide film is between 20 nm and 800 nm in order to reduce the parasitic capacitance between the control electrode and the bulk silicon substrate.

7. The device as claimed in claim 1, wherein the contact region, which is in contact with said metal layer, is made larger than the width of the Fin active region or the length of the control electrode, and also contacts with said metal layers, which are located on the upper sections and side surfaces of the control electrode and Fin active region, are formed in order to reduce the contact resistance.

8. The device as claimed in claim 1, wherein the thickness of said storage electrode is between 1 nm and 300 nm.

9. The device as claimed in claim 1, wherein said storage electrode is formed by nano-crystal or quantum dot.

10. The device as claimed in claim 9, wherein the size of said nano-crystal is between 3 nm and 10 nm.

11. The device as claimed in claim 1, wherein said storage electrode is an electrically isolated spacer type.

12. The device as in claim 1, wherein the storage electrode comprises at least one of poly-silicon (n+ or p+ doping), nitride film with a trap, poly-SiGe, or metal.

13. The device as claimed in claim 1, wherein if the substance of said storage electrode is made of a nitride film (Si3N4) which is an insulating material for SONOS, then the storage electrode only exists under the control electrode or on the whole surface.

14. The device as claimed in claim 1, wherein the thickness of said inter-gates oxide film is between 1 nm and 30 nm.

15. The device as claimed in claim 1, wherein source/drain parasitic resistance is reduced by selective epitaxial layer grown as a self-aligned manner on the both sides (source/drain regions) of the Fin active region except where it overlaps with the control gate and the insulator spacer near the control gate.

16. The device as claimed in claim 15, wherein said selective epitaxial material comprises at least one of single crystal silicon, single crystal SiGe, poly-silicon, or poly-SiGe.

17. The device as claimed in claim 1, wherein the junction depth for said source/drain region formed in the Fin active region, when the upper surface of the second oxide film is taken as the base line (0 nm), has a value greater than 0 nm and less than 50 nm above the base line.

18. The device as claimed in claim 1, wherein the junction depth for said source/drain region formed in the Fin active region, when the upper surface of the second oxide film is taken as the base line (0 nm), has a value greater than 0 nm and less than −50 nm below the base line.

19. The device as claimed in claim 1, wherein the width of said Fin active region is not constant along the Fin body in vertical direction, but the active region is wider near the substrate than it is away from the substrate.

20. The device as claimed in claim 1, wherein said Fin active region is in the form of a trapezoidal shape which has a narrower width at the top and a wider width at the bottom.

21. The device as claimed in claim 1, wherein the two corners of said Fin active region could be rounded off by an oxidation process, etching process or annealing process under a hydrogen environment.

22. The device as claimed in claim 2, wherein the height of said Fin active region from the surface of the bulk silicon substrate is between 10 nm and 1000 nm.

23. The device as claimed in claim 22, wherein the height of said Fin active region from the surface of the second oxide film is between 5 nm and 300 nm.

24. The device as in claim 9, wherein the storage electrode comprises at least one of poly-silicon (n+ or p+ doping), nitride film with a trap, poly-SiGe, or metal.

25. The device as in claim 11, wherein the storage electrode comprises at least one of the poly-silicon (n+ or p+ doping), nitride film with a trap, poly-SiGe, or metal.

26. The device as claimed in claim 15, wherein the junction depth for said source/drain region formed in the Fin active region, when the upper surface of the second oxide film is taken as the base line (0 nm), has a value greater than 0 nm and less than 50 nm above the base line.

27. The device as claimed in claim 15, wherein the junction depth for said source/drain region formed in the Fin active region, when the upper surface of the second oxide film is taken as the base line (0 nm), has a value greater than 0 nm and less than −50 nm below the base line.

* * * * *